United States Patent
Willkofer et al.

(10) Patent No.: US 9,768,766 B2
(45) Date of Patent: Sep. 19, 2017

(54) ELECTRONIC SWITCHING ELEMENT AND INTEGRATED SENSOR

(71) Applicant: Infineon Technologies Austria AG, Villach (AT)

(72) Inventors: Stefan Willkofer, Munich (DE); Gernot Langguth, Oberhaching (DE); Wolfgang Roesner, Ottobrunn (DE); Andreas Grassmann, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 19 days.

(21) Appl. No.: 14/330,837

(22) Filed: Jul. 14, 2014

(65) Prior Publication Data
US 2016/0013639 A1  Jan. 14, 2016

(51) Int. Cl.
*H03K 17/082* (2006.01)
*H03K 17/08* (2006.01)

(52) U.S. Cl.
CPC . *H03K 17/0828* (2013.01); *H03K 2017/0806* (2013.01)

(58) Field of Classification Search
CPC  H02H 7/00; H02H 7/205; H02H 9/00; H02H 9/04; H02H 9/044; H03K 17/00; H03K 17/04123; H03K 17/063; H03K 17/168; H03K 17/687; H03K 17/6874
USPC .......................................... 327/434
See application file for complete search history.

(56) References Cited

U.S. PATENT DOCUMENTS

| | | | |
|---|---|---|---|
| 2003/0116820 A1* | 6/2003 | Daubenspeck ... | H01L 21/76807 257/529 |
| 2008/0048215 A1* | 2/2008 | Davies ............... | H01L 27/0262 257/274 |
| 2009/0066404 A1* | 3/2009 | Heppenstall ........ | H01L 27/0248 327/513 |
| 2015/0346037 A1* | 12/2015 | Kiep ...................... | H01L 35/34 374/178 |

* cited by examiner

*Primary Examiner* — Lincoln Donovan
*Assistant Examiner* — David Mattison
(74) *Attorney, Agent, or Firm* — Shumaker & Sieffert, P.A.

(57) ABSTRACT

A circuit may comprise an electronic switching element, an integrated sensor, and a low-impedance path from one of the terminals of the sensor to one of the terminals of the electronic switching element.

15 Claims, 5 Drawing Sheets

ELECTRONIC SWITCHING ELEMENT AND INTEGRATED SENSOR

TECHNICAL FIELD

Embodiments of the present disclosure relate to ESD (electrostatic discharge) stability of electronic switching elements with additional sensing functionality.

SUMMARY

A first embodiment relates to a circuit comprising
an electronic switching element,
an integrated sensor,
a low-impedance path from one of the terminals of the sensor to one of the terminals of the electronic switching element.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Examples described herein in particular refer to an ESD (electrostatic discharge) stability (also referred to as ESD protection or ESD robustness) of semiconductors, in particular semiconductor switches like transistors, IGBTs, MOSFETs, JFETs or the like.

Known IGBTs are arranged to cope with high electric power, because of their high capacities between gate and emitter or gate and collector. This may lead to a ESD stability of ca. 8 kV in the human body model (HBM).

However, the semiconductors may be provided with additional features, e.g., comprising a current sense feature and/or a temperature sense feature. Each feature may be embedded in the semiconductor chip, e.g., the IGBT chip. Based on such additional feature, the semiconductor becomes more susceptible to ESD effects, which may decrease the ESD stability to, e.g., 2 kV or even below 500V according to the HBM.

Examples described herein increase the ESD stability of a semiconductor (e.g., transistor) with an integrated (embedded) feature.

Examples described herein in particular suggest providing a low impedance path (discharge path) in the semiconductor chip (comprising a transistor and an additional sense means) for the ESD event without any detrimental impact on the functionality of the transistor.

The transistor may comprise at least one of the following: an IGBT, an MOSFET, a JFET, a bipolar transistor, etc.

Hence, the low impedance path may be between a pad of the sense means and the emitter or ground of the transistor.

The sense means may in particular comprise a temperature sense means or a current sense means.

The current sense means may comprise an additional transistor in parallel to the actual transistor. In the following example, the actual transistor is shown as an IGBT Q2 and the current sense means is realized via an IGBT Q1.

Figure 1:
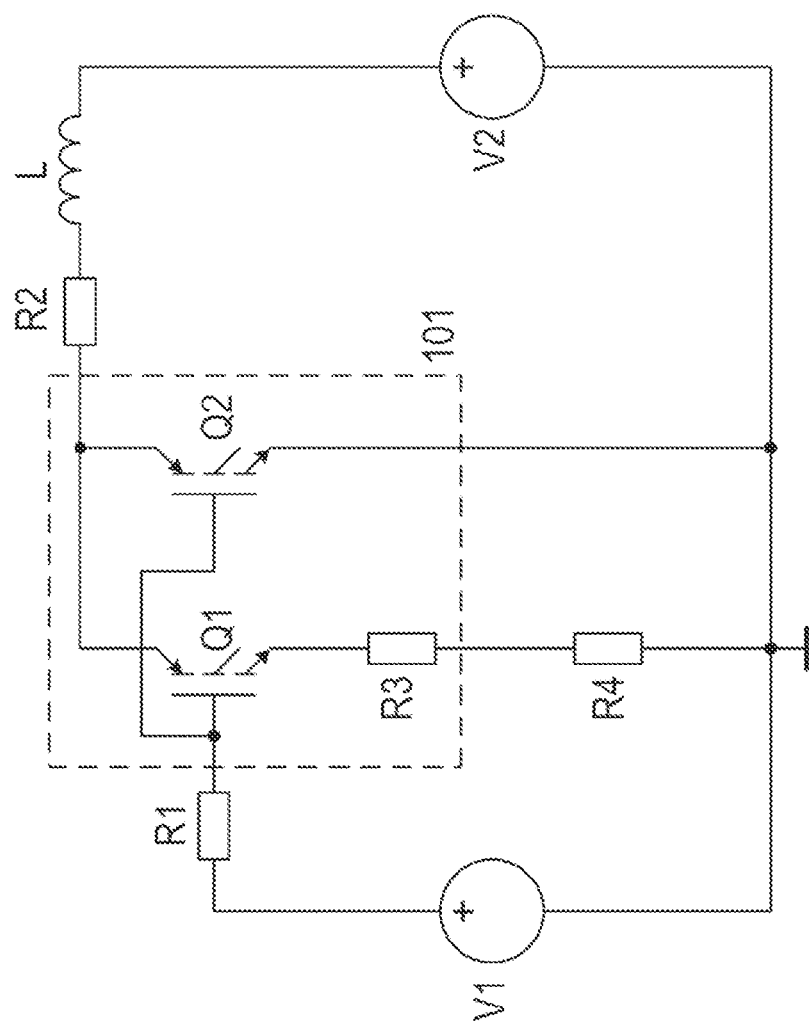
FIG. 1 shows an exemplary circuit diagram comprising two transistors that are combined with a resistor as temperature dependent device in a unit.

FIG. 1 shows an exemplary circuit diagram comprising two transistors Q1 and Q2 that are combined with a resistor R3 as temperature dependent device in a unit 101. The resistor R3 may have a positive (or negative) temperature coefficient and it may be embedded with the transistors Q1 and Q2. The transistors Q1 and Q2 may be IGBTs or MOSFETs deployed on the same piece of silicon. The transistors Q1 and Q2 may share a functional unit that may be arranged on a common (e.g., emitter) area. The functional unit may comprise a multitude of functional elements that may be split according to a predetermined ratio, e.g., 1:10000. Hence, the transistor Q1 may act as the current sensor which carries a significantly smaller amount of current compared to the transistor Q2. The transistors Q1 and Q2 may be discrete transistors, wherein each of the transistor may have a split emitter pad or a split source pad. The transistors Q1 and Q2 may in particular be deployed on a single chip or die.

The functional unit may be based on a structure, in particular an area on the device. The area may comprise at least one of the following: a gate-source area, a base-emitter area, an IGBT cell, an IGBT stripe, etc. Also, combinations of the above may also be used as an area.

According to FIG. 1, the gate of the IGBT Q1 is connected with the gate of the IGBT Q2. The collectors of the IGBTs Q1 and Q2 are connected and are further connected to a load R2. The emitter of the IGBT Q1 is connected via a resistor R4 (sense resistor) to ground. The emitter of the IGBT Q2 is connected to ground. The gate of the IGBT Q1 is controlled via a voltage source V1 and a resistor R1 and the load R2 are further connected via an inductor L to a voltage source V2. The voltage sources V1 and V2 as well as the load R2 in combination with the inductor L are only exemplary elements of a circuitry in which the unit 101 can be used. The combination of the load R2 and the inductor L are also referred to as an R-L-load.

The resistor R3 may be realized as a temperature compensating element, which may show an increase in resistance with an increase in temperature. Hence, a voltage that can be determined at a node between the resistors R3 and R4, i.e. as voltage across the resistor R4, which is proportional to the current flowing through the current sense resistor R4, is substantially unbiased by variations of temperature.

The resistor R4 may in particular be deployed separately from the unit 101, in particular external to a chip that comprises the unit 101.

The resistor R3 may be integrated together with the IGBTs Q1 and Q2 in the unit 101. The temperature coefficient of the resistor R3 may be positive, substantially linear (corresponding in particular to the temperature coefficient of the voltage between the collector and the emitter of the IGBT Q1) and, in some cases, large.

In some examples, the temperature coefficient of the resistor may be at least +60% over 100K. For example, the resistor R3 may comprise, e.g., nickel (67% over 100K). It may have a resistance value in the range between 1 Ohm and 10 Ohm at a temperature of 25° C. In some examples, the accuracy of the resistor R3 may be as high as possible, in particular better than 5%. The resistor R3 may also comprise, e.g., aluminum, doped poly-silicon, beryllium (100% over 100K), titanium, titanium-nitride, tungsten, titanium-tungsten, tantalum, tantalum-nitride and/or copper. It is noted that the resistor R3 may in particular comprise a material that can be used as a barrier layer.

When the IGBT's temperature increases, the collector-emitter saturation voltage $V_{CEsat}$ increases. When the MOSFET's temperature increases, the drain-source voltage increases due to an increasing resistance $R_{DSon}$.

This resistor R3 may carry the sense current (e.g., up to 100 mA). Hence, the resistor R3 may be adjusted accordingly. In addition, a current sense ratio may be adjusted, e.g., via functional units of the transistors Q1 and Q2 to reduce the sense current amount and to hence avoid any overload situation at the resistor R3. For example, the functional units of the transistors Q1 and Q2 may differ at a ratio of 1:10000 (with the transistor Q1 having the smaller amount of functional units) in order to allow for a small sense current compared to the current flowing through the load and the transistor Q2.

As an example, the resistor R3 may be implemented as a resistive element, e.g., a resistive layer on a chip. The resistive element may comprise aluminum, nickel, tungsten, iron etc. The resistive element may be in close proximity to the transistor Q1. The resistive element can be a locally concentrated element or somewhat distributed across the circuitry.

The examples described herein provide ESD stability also for the transistor Q1, which may otherwise face a substantially higher risk of being destroyed compared to the transistor which has a substantially higher number of functional elements.

The example shown in FIG. 1 allows for temperature-compensated current measurement. As an option, the temperature compensation via the resistor R3 may be omitted.

On the other hand, a temperature sensor can be provided according to the example of resistor R3 above. As an alternative, the temperature sensor may comprise a series connection of at least one pn-diode, wherein optionally another second diode is arranged anti-parallel to the series connection. This anti-parallel diode may in particular comprise flat poly-silicon with suitable p- and n-doping and metallic contact. As the characteristics of the diode is temperature-dependent, an applied current can be used to determine a voltage drop Vf, which further allows determining the temperature.

The diode(s) may be applied on a thermal oxide (isolator) or other oxide layer with insulating properties or a combination of layers. Basically, the diode(s) may be applied on any sort of isolation against the silicon bulk material.

The examples described herein provide ESD stability also for the temperature sensor, which may otherwise face a substantially higher risk of being destroyed compared to the transistor.

Figure 2:
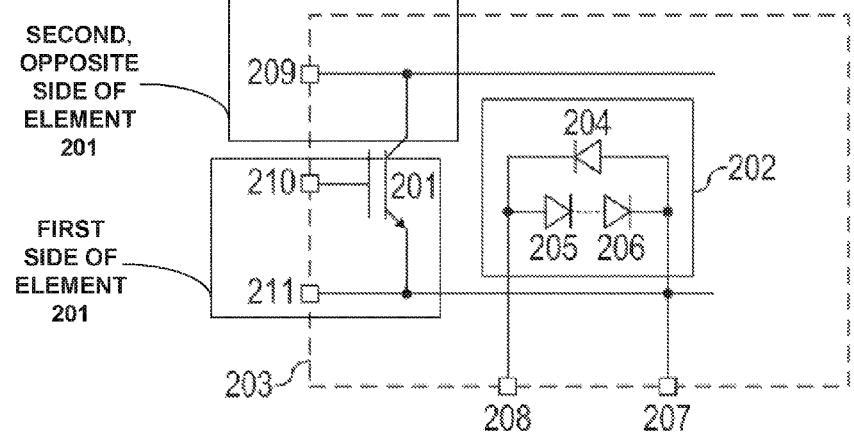
FIG. 2 shows an exemplary circuit diagram comprising a transistor, which is arranged together with a temperature sensor on a chip.

FIG. 2 shows an exemplary circuit diagram comprising a transistor 201, which is arranged together with a temperature sensor 202 on a chip 203. The temperature sensor 202 comprises a series connection of several diodes 205 and 206, wherein the cathodes of the diodes 205 and 206 point towards a terminal 207 (also referred to as cathode of the temperature sensor 202). The anode of the diode 205 is connected to a terminal 208, which determines the anode of the temperature sensor 202. A diode 204 is connected across the series connection comprising the diodes 205 and 206, wherein the cathode of the diode 204 is connected to the anode of the diode 205 and the anode of the diode 204 is connected to the cathode of the diode 206. The diode 204 is hence arranged anti-parallel to the series connection comprising the diodes 205 and 206.

It is noted that the series connection comprising the diodes 205 and 206 may comprise more than two diodes, which may then have the same orientation as the diodes 205 and 206.

The transistor 201 is an IGBT comprising a collector 209, a gate 210 and an emitter 211. The terminal 207 of the temperature sensor 202 is connected with the emitter 211. Hence, the circuitry shown in FIG. 1 has four terminals, because the terminal 207 and the emitter 211 are combined.

By connecting one of the terminals of the temperature sensor 202 with the emitter 211, cathode of the temperature sensor 202 (in case the terminal 207 is connected with the emitter 211) or the anode of the temperature sensor 202 (in case the terminal 208 is connected with the emitter 211 not shown in FIG. 2) reaches an ESD stability that corresponds to the ESD stability of the emitter 211 of the IGBT 201.

The emitter of the IGBT 201 is connected to a large capacitance thereby supplying a high degree of ESD stability. In addition, the IGBT 201 opens in case of a floating gate, which increases its conductivity.

Figure 3:
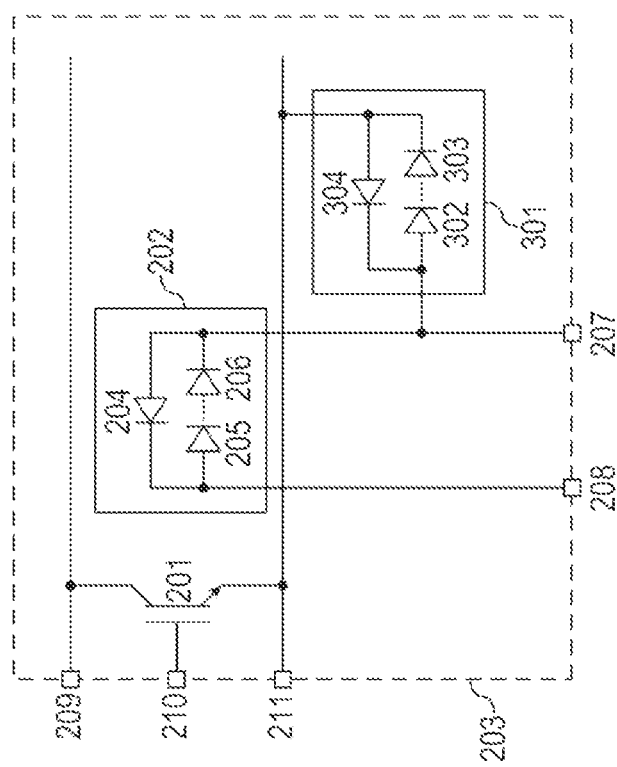
FIG. 3 shows an alternative exemplary circuit diagram comprising the transistor and the temperature sensor, wherein at least one of the terminals of the temperature sensor are coupled to the emitter via an additional circuitry.

FIG. 3 shows an alternative exemplary diagram comprising the transistor 201 and the temperature sensor 202, wherein at least one of the terminals 207 or 208 of the temperature sensor 202 are coupled to the emitter 211 via a circuitry 301.

In FIG. 3, the terminal 207 (cathode of the temperature sensor) is connected to the emitter 211 via the circuitry 301. The circuitry comprises a series connection of n pn-diodes 302, 303 (e.g., poly-silicon on an isolator), wherein the cathodes of these diodes point towards the emitter 211. An anti-parallel diode 304 is arranged across the series connection of diodes 302, 303.

In case of an ESD event, the charge can equalize via the diodes 302, 303 to the emitter 211. The temperature sensor 202 hence obtains the ESD stability of the emitter 211.

This solution bears the advantage that the potential at the terminal 207 may be different from the potential at the emitter 211 to an extend adjustable via the n diodes 302, 303. In case (of room temperature) a voltage of 0.7V drops across each of the diodes 302, 303, a number of n diodes may be used to adjust the potential Vk at the cathode (terminal 207) of the temperature sensor according to $Vk=0.7V*n.$ Using poly-silicon bears the advantage that no significant parasitic effects occur. Hence, a significant amount of n diodes can be arranged in series without substantially increasing the leakage current during normal operation.

It is noted that the circuitry 301 can be arranged between the terminal 207 of the temperature sensor 202 and the emitter 211 and/or between the terminal 208 of the temperature sensor 202 and the emitter 211.

Figure 4:
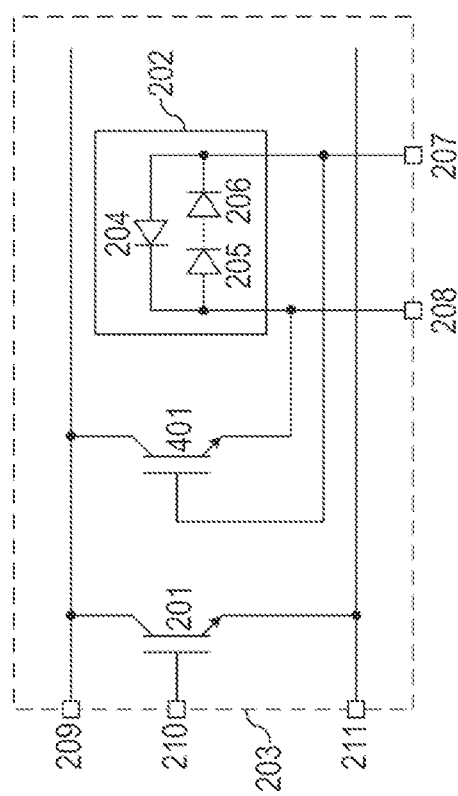
FIG. 4 shows yet another alternative exemplary circuit diagram comprising the transistor, an additional transistor and the temperature sensor.

FIG. 4 shows another alternative exemplary circuit diagram comprising the IGBT 201, a transistor 401 (e.g., an IGBT comprising collector, emitter and gate) and the temperature sensor 202.

The collector of the IGBT 401 is connected to the collector 209 of the IGBT 201, the emitter of the IGBT 401 is connected to the terminal 208 and the gate of the IGBT 401 is connected to the terminal 207 of the temperature sensor 202.

In some examples, the gates of the IGBT 201 and the IGBT 401 are separated from each other.

In case of an ESD event between the terminal 207 (cathode of the temperature sensor 202) and one of the other contacts (209 to 211) the gate of the IGBT 201 is floating and the IGBT 201 opens during the ESD event; this results in an activation of the IGBT 401, which allows the charge to equalize.

In case of an ESD event between the terminals 207 and 208, the ESD stability is defined by the chain of serial diodes of the temperature sensor 202.

The temperature sensor 202 may comprise (at least) four pn-diodes in series, resulting in a forward voltage Vf amounting to 2.8V. In some examples, the forward voltage may be lower than the threshold voltage of the IGBT 401, amounting to, e.g., 5.8V.

This example allows a wide variation of voltages, in particular at the output terminals 207 and 208 of the temperature sensor 202.

Figure 5:
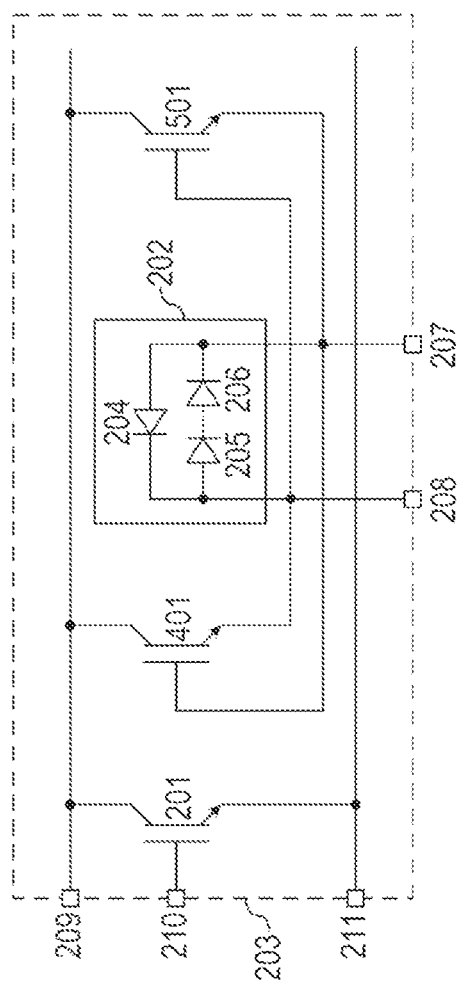
FIG. 5 shows another alternative exemplary circuit diagram based on FIG. 4 with two additional transistors to enable a symmetric case for both terminals of the temperature sensor.

FIG. 5 shows another alternative exemplary circuit diagram based on FIG. 4. In contrast to the embodiment of FIG. 4, FIG. 5 shows a symmetric case for both terminals 207 and 208 of the temperature sensor 202. An additional transistor 501 is provided as an IGBT, wherein the collector of the IGBT 501 is connected to the collector 209 of the IGBT 201, the gate of the IGBT 501 is connected to the terminal 208 and the emitter of the IGBT 501 is connected to the terminal 207.

The examples suggested herein may in particular be based on at least one of the following solutions, in particular combinations of the following features could be utilized in order to reach a desired result. The features of the method could be combined with any feature(s) of the device, apparatus or system or vice versa.

A circuit is provided, said circuit comprising:
an electronic switching element,
an integrated sensor,
a low-impedance path from one of the terminals of the sensor to one of the terminals of the electronic switching element.

Hence, such approach has the advantage that no or only minimal additional processing steps of the semiconductor are required and/or no or only minimal additional chip area is required. Accordingly, the approach is cost efficient and can be applied to a multitude of use-case scenarios.

The low-impedance path may be any path or connection from one terminal of the sensor to one terminal of the electronic switching element, which may in particular enable a charge to equalize, e.g., discharge an ESD event. Hence, the ESD stability of the electronic switching element is supplied to the circuit also comprising the integrated sensor.

Said integrated sensor may in particular be a current sensor or a temperature sensor arranged together with the electronic switching element, in particular on the same chip or die as the electronic switching element.

The electronic switching element may be a (e.g., vertical) power switch or it may comprise at least one (e.g., vertical) power switch.

In an embodiment, the integrated sensor is part of the electronic switching element.

In an embodiment, the electronic switching element and the integrated sensor are arranged on a single chip.

In an embodiment, the electronic switching element and the integrated sensor are arranged on a single chip and are separated by at least one dielectric medium, in particular comprising at least one dielectric layer.

In an embodiment, the electronic switching element is a vertical element comprising
a control terminal,
a first terminal, and
a second terminal,
wherein the first and the second terminal are electrically coupled via a signal applied to the control terminal, and
wherein the control terminal and the first terminal are arranged on one side of the vertical element and the second terminal is arranged at the opposite side of the vertical element.

The opposite side of the vertical element may also be connected to a load. The second terminal may be a collector of an electronic switch, in particular a transistor or IGBT. The first terminal may be an emitter and the control terminal may correspond to a gate of an IGBT or a base of a bipolar transistor. In case of a MOSFET, the source may correspond to the first terminal and the drain may correspond to the second terminal.

In an embodiment, the electronic switching element comprises at least one of the following:
a transistor;
a MOSFET;
an IGBT;
a JFET;
a diode; or
a vertical element.

In an embodiment, the integrated sensor is an integrated temperature sensor, which is arranged in the vicinity of the electronic switching element.

In an embodiment, the integrated temperature sensor comprises:
a series connection of at least two diodes, and
an additional diode, wherein the additional diode is connected anti-parallel across the series connection of the at least two diodes.

In an embodiment, the integrated temperature sensor comprises:
a barrier layer connecting at least two conductive elements,
wherein the barrier layer has a positive temperature coefficient.

In an embodiment, the barrier layer comprises at least one of the following
nickel;
aluminum;
iron;
permalloy;
beryllium;
titanium;
titanium-nitride;
tungsten;
titanium-tungsten;
tantalum;
tantalum-nitride; or
copper.

In an embodiment, the at least two conductive elements are arranged on top of the barrier layer.

In an embodiment, the low-impedance path is provided via one terminal of the integrated sensor being connected to an emitter or a source of the electronic switching element.

In an embodiment, the low-impedance path is provided via one terminal of the integrated sensor being connected to an emitter or a source of the electronic switching element via an additional circuitry.

In an embodiment, the additional circuitry comprises:
a series connection of at least two diodes, and
an additional diode, wherein the additional diode is connected anti-parallel across the series connection of the at least two diodes.

A number n of the diodes of the series connection can be used to adjust a potential Vk at a cathode of the temperature sensor according to Vk=0.7V*n.

In an embodiment, the low-impedance path is provided via an ohmic resistance.

Hence, a resistance can be supplied to connect at least one of the terminals of the sensor to one of the terminals of the electronic switching element.

In an embodiment, the low-impedance path is provided via at least one additional electronic switching element.

In an embodiment,
one of the terminals of the sensor is connected to an emitter or to a source of the additional electronic switching element,
the other of the terminals of the sensor is connected to a base or a gate of the additional electronic switching element, and
a collector or drain of the additional electronic switching element is connected to a collector or drain of the electronic switching element.

In case the sensor is a temperature sensor comprising a series connection of at least two diodes, the anode of the series connection may be connected to the emitter or source of the additional switching element and the cathode of the series connection may be connected to the base or gate of the additional switching element.

In an embodiment,
the low-impedance path is provided via a first additional electronic switching element and via a second additional electronic switching element,
one of the terminals of the sensor is connected to an emitter or to a source of the first additional electronic switching element and to a base or gate of the second additional electronic switching element,
the other of the terminals of the sensor is connected to a base or a gate of the first additional electronic switching element and to a emitter or source of the second additional switching element, and
a collector or drain of the first additional electronic switching element and a collector or drain of the second additional switching element are connected to a collector or drain of the electronic switching element.

In case the sensor is a temperature sensor comprising a series connection of at least two diodes, the anode of the series connection may be connected to the emitter or source of the first additional switching element (and the base or gate of the second additional switching element) and the cathode of the series connection may be connected to the base or gate of the first additional switching element (and to the emitter or gate of the second additional switching element).

The additional electronic switching elements(s) may be of the same type or of different type as the switching element. Each of the switching elements mentioned herein may in particular comprise at least one of the following: a transistor; a MOSFET; an IGBT; a JFET; a diode; a vertical element.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A circuit comprising:
an electronic switching element,
an integrated temperature sensor that is arranged in the vicinity of the electronic switching element and that comprises a series connection of at least two diodes and an additional diode that is connected anti-parallel across the series connection of the at least two diodes, and
a low-impedance path from one of the terminals of the integrated temperature sensor to one of the terminals of the electronic switching element.

2. The circuit according to claim 1, wherein the integrated temperature sensor is part of the electronic switching element.

3. The circuit according to claim 1, wherein the electronic switching element and the integrated temperature sensor are arranged on a single chip.

4. The circuit according to claim 1, wherein the electronic switching element and the integrated temperature sensor are arranged on a single chip and are separated by at least one dielectric medium, wherein the at least one dielectric medium comprises at least one dielectric layer.

5. The circuit according to claim 1, wherein the electronic switching element is a vertical element comprising
a control terminal,
a first terminal, and
a second terminal,
wherein the first and the second terminal are electrically coupled via a signal applied to the control terminal.

6. The circuit according to claim 1, wherein the electronic switching element comprises at least one of the following:
a transistor;
a MOSFET;
an IGBT;
a JFET;
a diode; or
a vertical element.

7. The circuit according to claim 1, wherein the integrated temperature sensor further comprises a barrier layer connecting at least two conductive elements, and
the barrier layer has a positive temperature coefficient.

8. The circuit according to claim 7, wherein the barrier layer comprises at least one of the following:
nickel;
aluminum;
iron;
permalloy;
beryllium;
titanium;
titanium-nitride;
tungsten;
titanium-tungsten;

tantalum;
tantalum-nitride; or
copper.

9. The circuit according to claim 1, wherein the low-impedance path is provided via one terminal of the integrated temperature sensor being connected to an emitter or a source of the electronic switching element.

10. The circuit according to claim 1, wherein the low-impedance path is provided via one terminal of the integrated temperature sensor being connected to an emitter or a source of the electronic switching element via an additional circuitry the series connection of at least two diodes and additional diode that is connected anti-parallel across the series connection of the at least two diodes.

11. The circuit according to claim 1, wherein the low-impedance path is provided via an ohmic resistance.

12. The circuit according to claim 1, wherein the low-impedance path is provided via at least one additional electronic switching element.

13. The circuit according to claim 12,
wherein one of the terminals of the integrated temperature sensor is connected to an emitter or to a source of the additional electronic switching element,
wherein the other of the terminals of the integrated temperature sensor is connected to a base or a gate of the additional electronic switching element, and
wherein a collector or drain of the additional electronic switching element is connected to a collector or drain of the electronic switching element.

14. The circuit according to claim 1,
wherein the low-impedance path is provided via a first additional electronic switching element and via a second additional electronic switching element,
wherein one of the terminals of the integrated temperature sensor is connected to an emitter or to a source of the first additional electronic switching element and to a base or gate of the second additional electronic switching element,
wherein the other of the terminals of the integrated temperature sensor is connected to a base or a gate of the first additional electronic switching element and to a emitter or source of the second additional switching element, and
wherein a collector or drain of the first additional electronic switching element and a collector or drain of the second additional switching element are connected to a collector or drain of the electronic switching element.

15. The circuit according to claim 5, wherein the electronic switching element comprises a transistor, and wherein the control terminal comprises a base of the transistor, the first terminal comprises an emitter of the transistor, and the second terminal comprises a collector of the transistor.

* * * * *